(12) United States Patent
Kamerman

(10) Patent No.: US 8,942,121 B2
(45) Date of Patent: Jan. 27, 2015

(54) COMMUNICATION DEVICE

(75) Inventor: Adriaan Kamerman, Nieuwegein (NL)

(73) Assignee: GreenPeak Technologies B.V. (NL)

( * ) Notice: Subject to any disclaimer, the term of this patent is extended or adjusted under 35 U.S.C. 154(b) by 145 days.

(21) Appl. No.: 13/510,274

(22) PCT Filed: Nov. 20, 2009

(86) PCT No.: PCT/NL2009/050703
§ 371 (c)(1),
(2), (4) Date: Jul. 9, 2012

(87) PCT Pub. No.: WO2011/062478
PCT Pub. Date: May 26, 2011

(65) Prior Publication Data

US 2012/0269083 A1 Oct. 25, 2012

(51) Int. Cl.
*H04L 12/26* (2006.01)
*H04B 7/08* (2006.01)
*H04B 1/10* (2006.01)

(52) U.S. Cl.
CPC .............. *H04B 7/0811* (2013.01); *H04B 1/109* (2013.01); *H03F 2200/294* (2013.01)
USPC ........................................................ 370/252

(58) Field of Classification Search
None
See application file for complete search history.

(56) References Cited

U.S. PATENT DOCUMENTS

| | | | |
|---|---|---|---|
| 2002/0118780 A1* | 8/2002 | Hurley et al. ................. | 375/347 |
| 2004/0018815 A1 | 1/2004 | Lin et al. | |
| 2004/0063412 A1 | 4/2004 | Kim et al. | |
| 2004/0266375 A1* | 12/2004 | Li et al. .......................... | 455/140 |
| 2005/0148306 A1* | 7/2005 | Hiddink ........................ | 455/101 |
| 2007/0066244 A1* | 3/2007 | Kao et al. ......................... | 455/78 |
| 2007/0213018 A1* | 9/2007 | Ismail et al. ................ | 455/127.2 |
| 2008/0014890 A1* | 1/2008 | Hardacker et al. .......... | 455/249.1 |
| 2009/0073062 A1* | 3/2009 | Tang et al. .................... | 343/703 |
| 2009/0270060 A1* | 10/2009 | Hoo et al. .................. | 455/277.1 |
| 2010/0034326 A1* | 2/2010 | van Driest et al. ............ | 375/343 |

FOREIGN PATENT DOCUMENTS

WO 9934534 A1 7/1999

OTHER PUBLICATIONS

International Search Authority, International Search Report, Aug. 2, 2010, 3 pages.

* cited by examiner

Primary Examiner — Otis L Thompson, Jr.
(74) Attorney, Agent, or Firm — Meyer IP Law Group

(57) ABSTRACT

The invention relates to a communication device (2) comprising an antenna system (4) provided with at least one antenna (6a, 6b, 6c) for receiving a radio signal and supplying a received radio signal to an output (8) of the antenna system, a low noise amplifier (10) for amplification of the received radio signal to obtain an amplified radio signal, and a processing unit (12) for processing the amplified radio signal. The antenna system (4) is configured to supply in a first state a first antenna signal as the received radio signal and in a second state second antenna signal as the received radio signal, wherein the first antenna signal and second antenna signal differ in amplitude. The antenna system is further configured to switch from state in response to a control signal (14) generated by the processing unit (12).

11 Claims, 3 Drawing Sheets

COMMUNICATION DEVICE

PRIORITY CLAIM

This application claims priority to the following foreign patent application: International Patent Application No. PCT/NL2009/050703, filed Nov. 20, 2009, by Adriaan Kamerman, entitled COMMUNICATION DEVICE which is incorporated herein by reference.

The invention relates to a communication device, comprising an antenna system provided with at least one antenna for receiving a radio signal and supplying a received radio signal to an output of the antenna system, a low noise amplifier for amplification of the receive radio signal to obtain an amplified radio signal, and a processing unit for processing the amplified radio signal. More particularly, the invention relates to a transceiver with low power consumption, more particular to an IEEE 802.15.4 transceiver.

BACKGROUND OF THE INVENTION

U.S. Patent Publication No. U.S.2004/0063412 discloses a method employing attenuation of a received radiofrequency signal. This document describes a radio with a RSSI (received signal strength indicator) circuit to determine if the received signal exceeds a (high) power threshold and with attenuation through second antenna signal path (through the transmit/receive switch) to avoid saturation of the receiver that would complicate the recapture of data. This RSSI based antenna selection between first (non-attenuated) and second (intentional attenuated) antenna signal enables a radio with a better reception in case of a nearby transmit source. Such antenna selection approach with RSSI above a threshold does not react on interference introduced in the radio front-end itself.

U.S. Patent Publication No. U.S.2004/001885 discloses a wireless communication circuit architecture. Antenna diversity selection is disclosed with selecting one out of two antennas for receiving while one of these two is used for transmission and it mentions antenna selection based on best quality signal. No intentional attenuation of the received signal is disclosed.

Radio systems based on a standard like IEEE 802.15.4 (/ZigBee), IEEE 802.11 (/Wi-Fi) or IEEE 802.15.1 (/Bluetooth) are commonly known. These radio systems are provided with one or more antennas of a low-power and low-cost communication device which operates in an ISM band (Industrial, Scientific and Medical).

Radio systems that operate in the 2400-2483.5 MHz ISM band can be interfered by other radio's that are nearby and can cause high interference levels on nearby frequencies. Low-cost ISM band based radio's are applied for 802.15.4/RF4CE (Radio Frequency for Consumer Electronics) remote control applications and different system radio's are used in each other vicinity. With different 2.4 GHz based radio's in the same apparatus as a TV, set-top box or laptop computer the RF isolation between the two radio's could be in the order of magnitude of 20 dB, which corresponds to an equivalent of an interference distance of 10 cm.

These radio systems have in common, a radio front-end receiver design with some band filter and LNA (low noise amplifier) which are followed by mixer and channel filter. The system allows a large range of receive levels and interference to a certain extent. With low-cost, low-power radio's the cost and power consumption, the receiver front-end is not dimensioned for linearity over a very large input level range and the allowance of very high interference levels without spectrum regrowth by non-linear distortion. Spectral regrowth is an increase in the level of a range of frequencies that develops on each side of the carrier frequency (similar to side bands) and is caused by the LNA when it has to amplify an input signal with relative high amplitude toward saturation of the LNA. This causes intermodulation distortion, which generates the so-called spectral regrowth. With non-linear distortion the third order component leads to the spectrum regrowth of the 2.4 GHz interference signal in question. Non-linearity and signal degradation by the LNA can be characterized by the 1 dB compression point (the input level at which the amplifier output shows a degradation in the output level of 1 dB) and the third order intercept (the input level at which in the output of third order component becomes equal to the output of the first order component).

FIG. 1 illustrates the power spectrum shapes of an example of a desired 802.15.4 signal with channel frequency of 2475 MHz (802.15.4 channel number 25) (by a solid line) and the related 802.15.4 filtering in the receiver (by a dashed line), and an example of an 802.11n/20 MHz interference signal with a channel frequency of 2447 MHz (802.11 channel number 8) (by a solid line) and an example of the spectrum regrowth of this interference signal inside the victim 802.15.4 receiver (by a dashed line) due to high level input at the input of the LNA. Thus, a high level 802.11n signal will result in spectral regrowth in the output signal of the LNA. The spectral regrowth extends into the adjacent 802.15.4 signal band. Consequently, the spectral regrowth interferes with communication in the 802.15.4 signal band resulting in decreased signal to noise ratio (SNR) or signal to interference ratio (SIR).

Antenna diversity, also known as space diversity, is any one of several wireless diversity schemes that use two or more antennas to improve the quality and reliability of a wireless link. The GreenPeak Emerald GP500C, 2.4 GHz ZigBee-ready IEEE 802.15.4 Communication Controller comprises a built-in antenna diversity circuit. However, antenna diversity uses the strength or amplitude or signal-to-noise ratio (SNR) of the received radio signal to determine which antenna should be selected. If the desired radio signal at the output of the LNA comprises interference components due to spectral regrowth of a neighbouring wireless link, this increases the amplitude of the received radio signal resulting in selection of the antenna signal with the highest interference and thus lowest signal quality. Similarly, if a radio signal in a neighbouring frequency band of a desired radio signal channel is transmitted, both antennae will receive the strong radio signal of the neighbouring wireless link resulting at in spectral regrowth at the output of the LNA and interference in the desired frequency channel. Consequently, irrespective which antenna will be selected, the signal-to-noise ratio is decreased due to the spectral regrowth at the LNA.

SUMMARY OF THE INVENTION

The object of the invention is to provide a communication device with improved receiving characteristics.

According to the invention, this object is achieved by a communication device having the features of claim 1. Advantageous embodiments and further ways of carrying out the invention may be attained by the features mentioned in the dependent claims.

A communication device according to the invention is characterized in that the antenna system is configured to supply in a first state a first antenna signal as the received radio signal and in a second state a second antenna signal as the received radio signal, wherein the first and second antenna signal differ in amplitude, wherein the antenna system further is configured to switch from state in response to a control signal generated by the processing unit. The processing unit is configured to determine regularly for the first state and second state a first signal quality and second signal quality, respectively, wherein the processing unit is configured to generate for a subsequent radio signal a control signal corresponding to the first state if the first signal quality is higher than the second signal quality and a control signal corresponding to the second state if the second signal quality is higher than the first signal quality. By examining regularly the signal quality of both antenna signals which differ mainly in amplitude, variations with respect to neighbouring interfering signals could be detected and the state providing the best signal quality could be selected to process the radio signal that follows in time. The invention is based on the recognition that the desired radio signal provides a signal level at the antenna that is much higher than needed to recover the data packet from the radio signal. If the desired radio signal is a remote control signal to control for example home equipment such as a TV or a Home entertainment centre, the actual distance between the remote control and the home equipment will determine the signal strength at the antenna. Changing the distance will change the signal strength at the antenna. By having an active Wi-Fi or Bluetooth transceiver in the home equipment, or in the same room, these transmitted radio signals, which are undesired signals, could have a relative high signal level, resulting in spectral regrowth at the output of the LNA. Furthermore, the amount of interference from the undesired radio signal in the frequency channel of the desired signal decreases with the distance between the frequency channel of the desired signal and the frequency channel of the undesired signal. Consequently, the larger the frequency distance between the frequency channel carrying the desired signal and the frequency channel carrying the undesired signal, the more spectral regrowth is allowed to interfere with the desired signal such that a transmitted data packet can not be recovered from the signal at the output of the LNA.

FIG. 2 illustrates an example of the allowed 802.11n/20 MHz interference levels at different channel frequencies with regard to an 802.15.4 desired signal level of respectively −85 dBm, −65 dBm and −45 dBm, represented by dash-dot line 22a, solid line 22b and dashed line 22c, respectively. The horizontal axis indicates the frequency offset in MHz between the centre frequency of the desired signal and the centre frequency of the 802.11n/20 MHz interference signal. The vertical axis indicate the allowed level of the interfering signal in dBm to have a Packet Error Rate (PER) of 10%. With more frequency distance the interference is allowed to be stronger because of a better filter suppression after the LNA. With lower and medium receive levels of the desired signal the rejection looks very similar. When the interference becomes above a certain levels the ratio (or dB difference) between the allowed interference and the desired signal levels becomes smaller meaning the rejection goes down. For example, assume the desired radio signal and the interfering radio signal have a frequency offset of 20 MHz. In that case if the desired signal has a signal strength of −45 dBm, the maximum allowed interference signal strength for a PER 10% is −15 dBm. The signal strength difference between desired signal and interfering signal is 30 dB. However, if the desired signal has a signal strength of −65 dBm, the maximum allowed signal strength for a PER 10% is −25 dBm. Consequently, the signal strength difference between desired signal and interfering signal is increased to 40 dB. This all due to the effect that the LNA has less or almost no spectral regrowth at lower signal levels. Thus, by lowering the signal level at the input of the LNA the performance of the receiver with respect to sensitivity of neighbouring interfering radio signals increases.

Always reducing the received radio signal would result in a decrease of the allowed distance between the remote control and home equipment. Therefore, a kind of antenna diversity is used to supply a normal received antenna signal, i.e. non processed with respect to signal level, and an attenuated received antenna signal, being an attenuated version of the normal received antenna signal. The signal quality in terms of for example the degree of correlation or PER in stead of the signal level is now used to determine the best antenna signal.

In an embodiment of the invention, the antenna system comprises a switching unit having a switch input coupled to an antenna and a switch output coupled to the output of the antenna system. The switching unit comprises an open state and a closed state. The switch is configured to supply to the switch output in the closed state the RF signal received at the switch input and in the open state an attenuated version of a RF signal received at the switch input. In another embodiment of the invention, the antenna system comprises a multiplexer with a first, a second input and an output, wherein the first input is coupled to the input of the switch unit and the second input is not connected, i.e. floating, or terminated by a low impedance. The multiplexer has a control input for receiving a control signal generated by the processing unit and configured to connect the first input or the second input to the output in response to the control signal. It is commonly known that the input and output of an open switch or a not selected input port of a multiplexer is not perfectly isolated from the output of the switch or multiplexer but has a determined switch loss. Switches and multiplexers can be designed to have a defined switch loss of for example 20 dB. In this way a simple switch or multiplexer could be used to select between an antenna signal and an attenuated version of said antenna signal.

In another embodiment of the invention, the antenna system comprises a first antenna, a second antenna, a RF attenuator and a multiplexer. The first antenna is coupled to a first input of the multiplexer. The second antenna is coupled to an input of the RF attenuator and an output of the RF attenuator is coupled to a second input of the multiplexer. The multiplexer has a control input for receiving a control signal generated by the processing unit and configured to connect the first input or the second input to the output in response to the control signal. In the event the multiplexer does not provide the desired switch loss, a second antenna and conventional RF attenuator could be used to supply an antenna signal representing the radio signal and an antenna signal representing an attenuated version of the radio signal to the LNA and receiver.

The attenuation of the attenuated version of an antenna signal with respect to the original antenna signal is in the range of 10-60 dB, more particularly in the range of 20-40 dB.

In an embodiment, the processing unit is configured to determine regularly for the first state and second state a first signal quality and second signal quality, respectively, wherein the processing unit is configured to generate for a subsequent radio signal a control signal corresponding to the first state if the first signal quality is higher than the second signal quality and a control signal corresponding to the second state if the second signal quality is higher than the first signal quality. By examining regularly the signal quality of both antenna signals which differ mainly in amplitude, variations with respect to neighbouring interfering signals could be detected and the state providing the best signal quality could be selected to process the radio signal that follows in time.

In an embodiment, the first signal quality and second signal quality have been obtained by performing a correlation function on the amplified radio signal. The correlation value obtained by the correlation function has been found a good measure of signal quality.

In an embodiment, the processing unit is configured to determine for each state a packet error rate (PER) and to generate the control signal in dependence of the packet error rate and signal quality for each state. This feature is advantageous for determining the performance over a longer time period and to use the actual detected signal quality for each antenna signal only when a slow change of environmental conditions is measured, i.e. the packet error rate for each state changes. In this way, a temporal decrease/increase in signal quality while measuring the signal quality will not result in a change of state of the antenna system to receive the subsequent radio signals.

In an embodiment, the processing unit is configured to retrieve data packets from the amplified radio signal, wherein a data packet comprises a preamble part followed in time by a data part, wherein the communication device is configured to derive the first signal quality signal and second signal quality signal from the amplified radio signal carrying the preamble part of a data packet and to select the state with the highest signal quality for processing the amplified radio signal carrying the data part of said data packet. These features enables the processing unit to determine in a very short time the signal quality of the respective antenna system states and allows the processor to select for the following data part of a packet to use the antenna signal having the best signal quality. This embodiment is very useful in low power applications wherein a data packet is occasionally transmitted, such as with an 802.15.4. transceiver.

Another object of the invention is to provide an improved method of receiving data packets from a radio signal, such as an 802.15.4. radio signal. The method comprises:

retrieving at least two antenna signals, wherein the at least two antenna signals differ in amplitude and have been obtained by an antenna system having at least two states, wherein an antenna signal has a corresponding state;
determine for each of the at least two antenna signals a corresponding signal quality;
select the state of the at least two states providing the antenna signal having the highest signal quality.

In an embodiment, a data packet comprises a preamble part followed in time by a data part and the method determines the signal quality for each of the at least two antenna signals on the preamble part of a data packet and select for the data part of said data packet the state providing the antenna signal having the highest signal quality. This embodiment is advantageous in low power applications such as ZigBee.

It will be clear that the various aspects mentioned in this patent application may be combined and may each be considered separately for a divisional patent application. Other features and advantages of the invention will become apparent from the following detailed description, taken in conjunction with the accompanying drawings which illustrate, by way of example, various features of preferred embodiments of the invention.

BRIEF DESCRIPTION OF THE FIGURES

These and other aspects, properties and advantages of the invention will be explained hereinafter based on the following description with reference to the drawings, wherein like reference numerals denote like or comparable parts, and in which.

DESCRIPTION OF EMBODIMENTS

Figure 1:
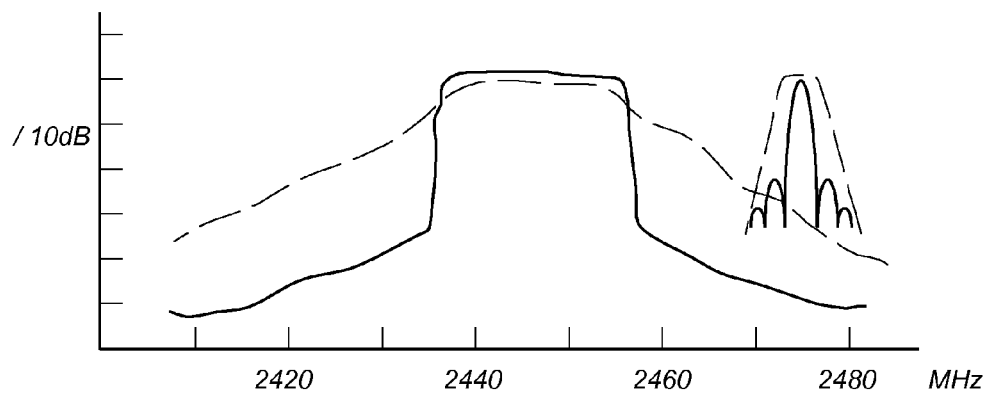
FIG. 1 illustrates an example of frequency spectrum shapes of desired 802.15.4 signal and interfering 802.11n signal.
Figure 2:
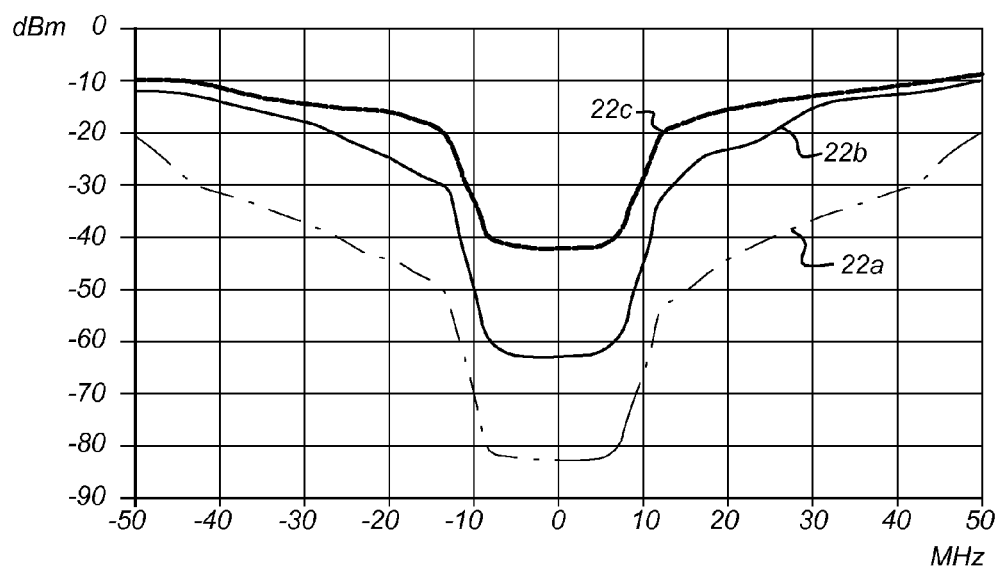
FIG. 2 illustrates allowed Wi-Fi interference corresponding to several desired signal levels.
Figure 3:
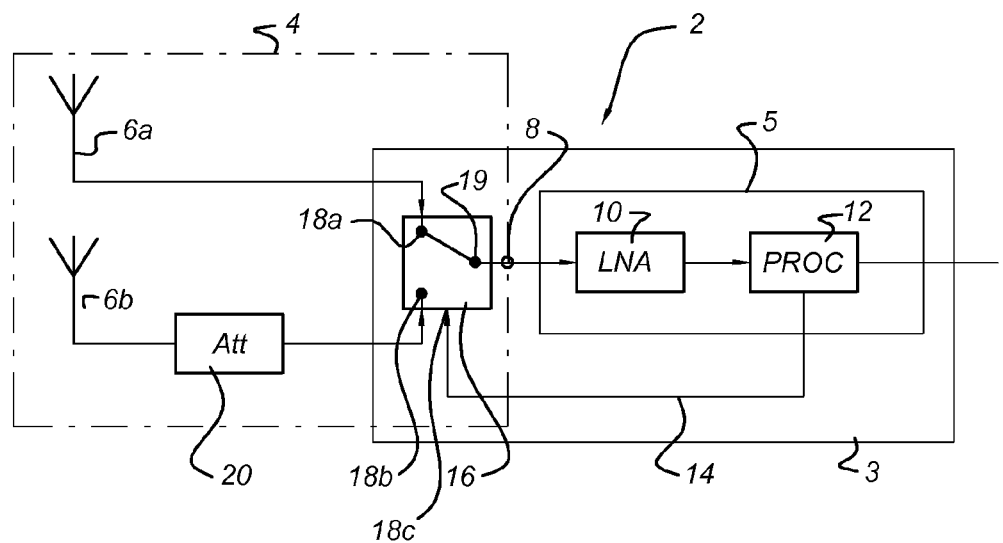
FIG. 3 shows a first embodiment of the communication device according to the invention.

FIG. 3 illustrates a first embodiment of a communication device 2 according to the invention. The communication device could be any radio with one or more antennae which operates in an ISM band, get nearby interference from other communication links that are based on a standard like IEEE 802.15.4 (/ZigBee), IEEE 802.11 (/Wi-Fi) or IEEE 802.15.1 (/Bluetooth). Low-cost ISM band based radio's are applied for 802.15.4/RF4CE remote control applications and different system radio's are used in each other vicinity. With different 2.4 GHz based radio's in the same apparatus as a TV, set-top box or laptop computer the RF isolation between two radio's could be in the order of magnitude of 20 dB, which corresponds to an equivalent of an interference distance of 10 cm. The communication device comprises an antenna system 4 and a transceiver chip 3. The transceiver chip processes the radio signal obtained via one of its antennae to derive a data packet from the radio signal. A data packet comprises preferably a preamble part or header part followed by a data part. As shown in FIG. 3, components of the antenna system could be part of the transceiver chip 3. It should be noted that the communication device could be a receiving only device, in that case the transceiver chip is a receiver chip.

The antenna system 4 comprises a first antenna 6a and a second antenna 6b. The second antenna 6b is coupled to an attenuator unit 20. The attenuator unit 20 attenuates the signal at its input with a predefined attenuation factor. Any conventional RF attenuator could be used to obtain the desired predefined attenuation factor. According to the invention, the attenuation factor could be in the range of 10-60 dB, more particular 20-40 dB. A very suitable attenuation factor is 20 dB. The attenuator unit 20 is configured to reduce the amplitude of the received RF signal frequencies received at its input with substantially the same factor to obtain an attenuated antenna signal. The antenna system 4 further comprises a multiplexer unit 16. The first antenna 6a is coupled to a first input 18a of the multiplexer 16. The output of the attenuator unit 20 is coupled to a second input 18b of the multiplexer unit 16. The multiplexer 16 comprises a control input 18c to receive a control signal and to select the first input 18a or the second input 18b in dependence of the control signal. In this way, a non-attenuated antenna signal and attenuated antenna signal could be selected by the multiplexer unit 16 and supplied to a multiplexer output 19. In this way an antenna system with two antenna paths is obtained. In a first state, the first antenna path comprising the first antenna supplies a radio signal received via the first antenna 6a as a first antenna signal to the output 8 of the antenna system 4. In a second state, the second antenna path comprising the second antenna 6b and attenuator 20 supplies an attenuated version of the radio signal received via the second antenna 6b as the second antenna signal to the output 8 of the antenna system 4.

The multiplexer output 19 is coupled to a low-noise amplifier (LNA). A LNA is a special type of electronic amplifier or amplifier used in communication systems to amplify very weak signals captured by an antenna. A LNA is often located very close to the antenna, so that losses in the feed line become less critical. LNA is a key component, which is placed at the front-end of a radio receiver circuit. The overall noise figure of the receiver front-end is dominated by the first few stages. Using a LNA, the noise of all the subsequent stages is reduced by the gain of the LNA, while the noise of the LNA itself is injected directly into the received signal. Thus, it is necessary for an LNA to boost the desired signal power while adding as little noise and distortion as possible so that the retrieval of this signal is possible in the later stages in the system. As said before, when a Wi-Fi like signal with a relative large amplitude or level is amplified by the LNA, this results in spectral regrowth at the output of the LNA. Due to the spectral regrowth, intermodulation frequencies of the Wi-Fi like signal will be present in the output signal having frequencies in the same frequency band as the frequency band of the desired signal. These intermodulation signals distort or interfere with the desired signal, resulting in less signal quality at the output of the receiver.

The output signal of the LNA 10, being an amplified radio signal, is processed by a processing unit 12. The processing unit 12 comprises a mixer, channel filter, decoders, etc. to derive data packets from the amplified antenna signal. The processing unit 12 is further configured to generate a control signal for controlling the multiplexer unit 16. The processing unit 12 comprises software or hardware to determine a first signal quality value for a radio signal received by the first antenna 6a and a second signal quality value for a radio signal received by the second antenna 6b. The signal quality is not based on the strongest signal after the LNA, but a measure influenced by the SNR (signal-to-noise ratio), SIR (signal-to-interference ratio) and/or distortion. Patent application PCT/NL2008/050047 discloses a method and receiver to determine the signal having the best signal quality. The method uses the modulation scheme of IEEE 802.15.4. The repeating pattern of the preamble of each packet is used to perform a correlation function and determine the quality of the received signal. The method allows us to determine during the transmission time of the preamble to determine for at least two antenna signals a correlation value and to determine the antenna signal having the best correlation. By means of this method it is possible to determine for each packet the antenna signal having the best signal quality during reception of the preamble and the possibility to select the antenna signal having the best signal quality to receive the remaining part, i.e. the data part, of a data packet. The dedicated processing in the receiver as described in PCT/NL2008/050047 results in a selection of the antenna signal which gives the best preamble correlation.

The present invention provides a certain significant extra attenuation for the second antenna signal path to make the level of the second antenna signal at the receiver front-end input lower. Such attenuation for the second antenna signal leads to a better rejection of interference due to less spectral regrowth of neighbouring channel which has a high level at the antenna output and an attenuated level at the output of the attenuator.

The present invention with extra attenuation for the second antenna signal gives in case of higher interference levels at both the first and second antenna outputs, allows by selection of the best quality signal the usage of the attenuated second antenna signal. Thus, with high interference levels and likewise desired signal levels the two antenna outputs, the signal-to-interference levels at the output of the two antennas will be likewise. However, with extra attenuation for the second antenna signal there will be a better signal quality and correlation due to less spectrum regrowth by lower levels in the LNA during the preamble reception with an antenna switch state corresponding to the second antenna signal. Therefore, this second antenna will be selected. Thus, the present invention allows a better rejection with higher interference levels, which is likewise to the rejection performed with lower levels.

Further, the present invention with extra attenuation for the second antenna signal allows selection of the first antenna signal in absence of higher interference. This means that with lower levels of the desired signal on both the first and second antenna output, the first antenna is selected and this allows reception at low levels using the first antenna and without having extra attenuation by usage of the second antenna signal. Due to the lower levels, there will be no spectral regrowth in both the first and second antenna. However, as the signal quality of the attenuated signal will be less than the other antenna signal, the antenna without attenuation will be selected for processing the remaining part of the data packet.

Antenna selection based on selection of the strongest signal will not lead to selecting based on the quality of the signal. However, when a method of antenna selection is used that selects the antenna with the first occurrence of a sufficiently quality preamble signal the selection of the second antenna signal with the extra attenuation can be performed to provide a better rejection in case of strong interference.

In another embodiment of the present invention the radio device such as an 802.15.4 transceiver and an interfering 802.11 radio share the same antenna by means of a power divider. Then, the 802.15.4 transceiver with antenna diversity selection uses an attenuation with regard to the second antenna signal to provide more receiver linearity. Further, the 802.11 transceiver has been designed with already more linearity in relation to the modulation structure based on multi-carrier and QAM modulation. The power divider gives a significant isolation in the order of magnitude of 15 dB between the 802.15.4 and 802.11 radio's.

In a more generic embodiment of the present invention there is applied an automatic selection of different input signals which have different levels. Then, the selection is based on the best quality of the processed received signal which can be subjected to degradation in the receiver due to a high level of the desired and/or the interference signal. In the generic case the usage of antenna diversity selection which takes place during the reception of the preamble, is less relevant. The automatic selection could be based on another way training or learning over a longer period and during various intervals and different input signals could be supplied outside or inside the receiver. For example, the processing unit 12 could be configured to determine for each state of the antenna system a packet error rate (PER) and to generate the control signal in dependence of the packet error rate for each state and the actual signal quality of the preamble of the current packet. For example, if there is no neighbouring interfering wireless link, the PER for the un-attenuated antenna signal will be much lower (and better) than for the attenuated antenna signal. When the signal quality of the attenuated signal is occasionally better than the un-attenuated signal, it can be assumed that the determination was due to a temporarily distortion during the transmission of the preamble and the un-attenuated signal for processing the data part of a packet will still give the best signal quality. However, as soon as for a subsequent packet is determined that the attenuated signal provides the best signal quality, this is an indication that a neighbouring channel has become active, and the attenuated antenna signal has to be selected for processing the data part.

In another antenna selecting algorithm, the number of erroneous bits of a data packet is used as signal quality. In this embodiment, a data packet is received entirely via the first or second antenna path and the corresponding quality for each antenna path is averaged over the last N received data packets. The ratio between the quality of the first and second antenna path is used to determine the cyclical pattern when the first and second antenna path is selected. For example if N is 10 and the ratio is 1:10, cyclical nine packets are received via the second antenna path and one packet is received via the first antenna path. If the ratio changes to 1:5, cyclical 4 packets are received via the second antenna path and one packet is received via the first antenna path. It might be clear that other selection algorithms are possible to optimize the selection process.

Figure 4:
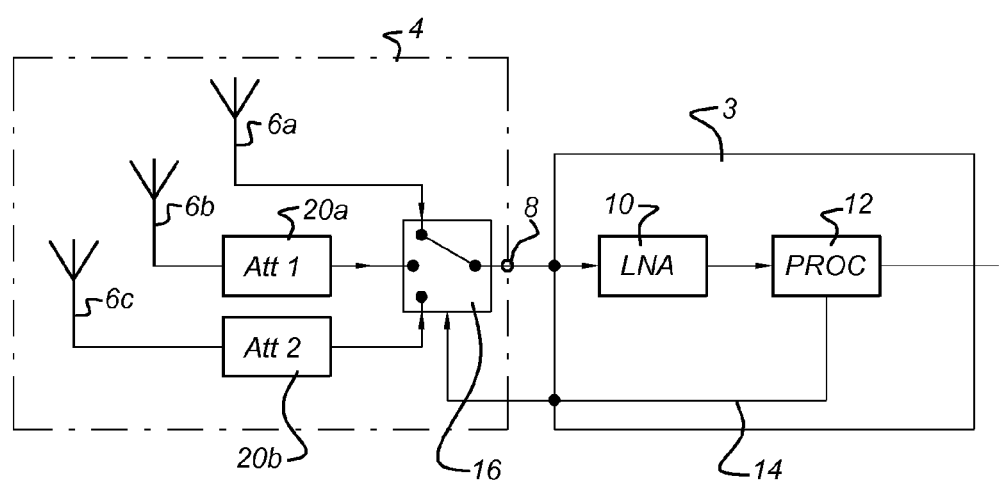
FIG. 4 shows a second embodiment of the communication device according to the invention.

FIG. 4 illustrates a second embodiment of the invention. This embodiment differs in that the receiver comprises a first antenna 6a, which is directly coupled to an input of a multiplexer. A second antenna 6b which is coupled via a first attenuator 20a to a second input of the multiplexer 16 and a third antenna 6c which is coupled via a second attenuator 20b to a third input of the multiplexer 16. The first attenuator and second attenuator have an attenuation value of for example 10 dB and 20 dB respectively. In this case the processing unit 12 is configured to determine for each input of the multiplexer the signal quality and to select the input corresponding to the best signal quality for the remaining part of a data packet or subsequent data packets. Another difference is that the multiplexer in the second embodiment is not part of the receiver chip 3. Therefore, the receiver chip 3 comprises only one antenna signal input and a control signal output for supplying a control signal to the external multiplexer unit 16.

Figure 5:
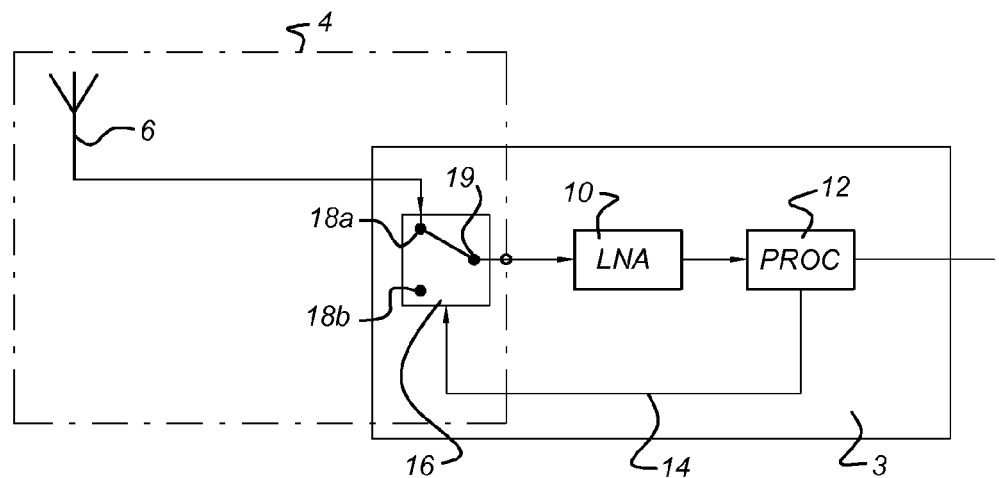
FIG. 5 shows a third embodiment of the communication device.

FIG. 5 illustrates a third embodiment of a communication device according to the invention. This embodiment comprises only one antenna 6 which is coupled to the first input 18a of the multiplexer 16. The second input 18b is not connected, i.e. floating, or terminated by a low impedance (not shown). A low impedance means a low impedance between the differential signal inputs in case the antenna signal supplied to the multiplexer is a differential or balanced antenna signal or about 50 ohm in case the antenna signal supplied to the multiplexer is an unbalanced signal, for example a 50 ohm coaxial signal. When during the preamble reception there is switched between the two inputs, the terminated second antenna port does not receive an input signal. However, because of a non-perfect switch loss the switch state for the second antenna leads to an attenuated first antenna signal. In common such switch can mean a loss of around 20 dB attenuation for the first antenna signal. Such attenuation of around 20 dB is well suitable for the application of the present invention.

Figure 6:
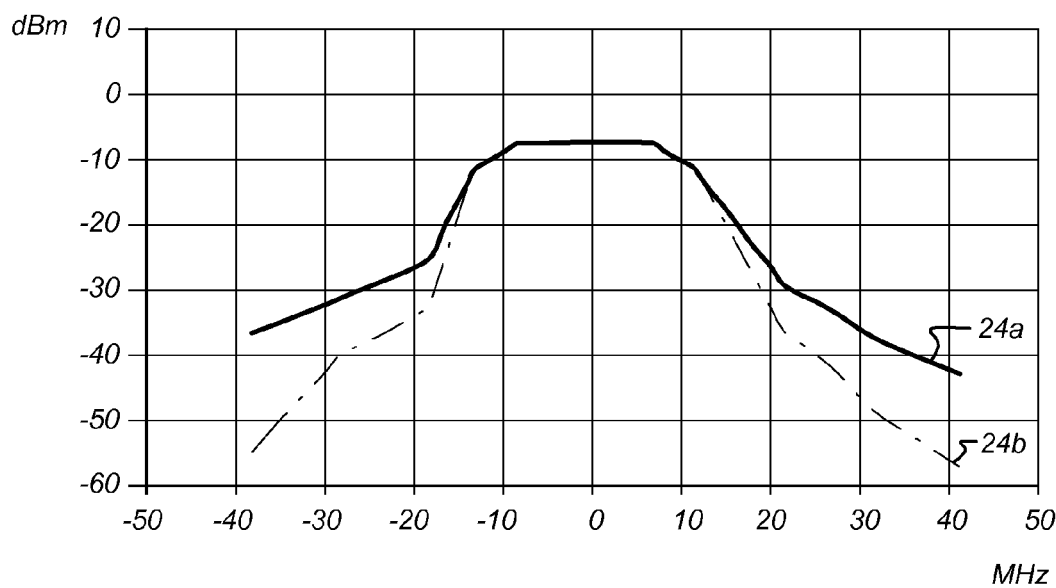
FIG. 6 illustrates the minimum required receive level of the desired signal in presence of a Wi-Fi 802.11n/20 MHz interference signal received at 0 dBm.

FIG. 6 illustrates the minimum required 802.15.4 receive level for a link reliability with a PER (packet error rate) of 10% or lower (which means better) in presence of strong Wi-Fi interference of 0 dBm. The dash-dot line 24b corresponds to the situation with using antenna selection as described with FIG. 5 that gives at the second antenna path state the attenuated signal because of the switch loss. This situation has been compared to the situation without antenna selection and just the fixed use of the first antenna signal, represented with the solid line 24a. The lower required receive levels when using an attenuated second antenna path signal dash-dot line 24b illustrates the capability of a larger range. Say with the allowance of a 15 dB lower minimum required desired 802.15.4 signal (in presence of 802.11 interference) there can be found a 4x larger range.

The measures described hereinbefore for embodying the invention can obviously be carried out separately or in parallel or in a different combination or if appropriate be supplemented with further measures; it will in this case be desirable for the implementation to depend on the field of application of the communication. The invention is not limited to the illustrated embodiments. Changes can be made without departing from the idea of the invention. For example, other antenna signal selection algorithms could easily be developed which still use at least two antenna signals from at least one antenna, wherein the two antenna signals differ in amplitude of the received antenna signal.

The invention claimed is:

1. A communication device (2) comprising
an antenna system (4) provided with at least one antenna (6a, 6b, 6c) for receiving a radio signal and supplying a received radio signal to an output (8) of the antenna system, a low noise amplifier (10) for amplification of the receive radio signal to obtain an amplified radio signal, and a processing unit (12) for processing the amplified radio signal, characterized in that the antenna system (4) is configured to supply in a first state a first antenna signal as the received radio signal through a first antenna path and in a second state a continuously attenuated second antenna signal as the received radio signal through a second antenna path,
wherein the first and second antenna signal differ in amplitude,
wherein the antenna system further is configured to switch from state in response to a control signal (14) generated by the processing unit (12),
wherein the processing unit (12) is configured to determine regularly for the first state of the first antenna path and second state of the second antenna path a first signal quality and second signal quality, respectively,
wherein the processing unit (12) is configured to generate for a subsequent radio signal a control signal corresponding to the first state if the first signal quality is higher than the second signal quality and a control signal corresponding to the second state if the second signal quality is higher than the first signal quality.

2. The communication device of claim 1,
wherein the antenna system (4) comprises a switching unit (16) having a switch input (18a) coupled to an antenna and a switch output (19) coupled to the output of the antenna system (4),
wherein the switching unit (16) comprises an open state and a closed state, and
wherein the switch is configured to supply to the switch output in the closed state the signal received at the switch input (18a) and in the open state an attenuated version of a RF signal received at the switch input (18a).

3. The communication device of claim 1,
wherein the antenna system comprises a multiplexer (16) with a first, a second input and an output,
wherein the first input is coupled to the input of the multiplexer (16) and the second input is not connected or terminated, the multiplexer (16) further having a control input for receiving a control signal generated by the processing unit and configured to connect the first input or the second input to the output in response to the control signal.

4. The communication device of claim 1,
wherein the antenna system comprises a first antenna (6a), a second antenna (6b), a RF attenuator (20) and a multiplexer (16), wherein the first antenna is coupled to a first input (18a) of the multiplexer, the second antenna (6b) is coupled to an input of the RF attenuator (20), an output of the RF attenuator (20) is coupled to a second input (18b) of the multiplexer (16), the multiplexer (16) having a control input (18c) for receiving a control signal (14) generated by the processing unit (12) and configured to connect the first input (18a) or the second input (18b) to the output (19) in response to the control signal.

5. The communication device of claim 1, wherein the attenuated second antenna signal has an attenuation in the range of 10 - 60 dB.

6. The communication device of claim 1, wherein the first signal quality and second signal quality have been obtained by performing a correlation function on the amplified radio signal.

7. The communication device of claim 1, wherein the processing unit (12) is further configured to determine for each state a packet error rate (PER) and to generate the control signal in dependence of the packet error rate and signal quality for each state.

8. The communication device of claim 1,
wherein the processing unit (12) is configured to retrieve data packets from the amplified radio signal,
wherein a data packet comprises a preamble part followed in time by a data part,
wherein the communication device is configured to derive the first signal quality signal and second signal quality signal from the amplified radio signal carrying the preamble part of a data packet and to select the state with the highest signal quality for processing the amplified radio signal carrying the data part of said data packet.

9. The communication device of claim 1, wherein the communication device is an 802.15.4 receiver.

10. A method of receiving data packets from a radio signal in a communication device comprising:
using an antenna system (4) provided with at least one antenna (6a, 6b, 6c) for receiving a radio signal and supplying a received radio signal to an output (8) of the antenna system, a low noise amplifier (10) for amplification of the receive radio signal to obtain an amplified radio signal, and a processing unit (12) for processing the amplified radio signal, characterized in that the antenna system (4) is configured to supply in a first state a first antenna signal as the received radio signal through a first antenna path and in a second state a continuously attenuated second antenna signal as the received radio signal through a second antenna path, wherein the first and second antenna signal differ in amplitude, wherein the antenna system further is configured to switch from state in response to a control signal (14) generated by the processing unit (12), wherein the processing unit (12) is configured to determine regularly for the first state and second state a first signal quality and second signal quality, respectively, wherein the processing unit (12) is configured to generate for a subsequent radio signal a control signal corresponding to the first state if the first signal quality is higher than the second signal quality and a control signal corresponding to the second state if the second signal quality is higher than the first signal quality;
retrieving at least two antenna signals, wherein the at least two antenna signals differ in amplitude and have been obtained by an antenna system having at least two states, wherein an antenna signal has a corresponding state;
determining for each of the at least two antenna signals a corresponding signal quality; and
selecting the state of the at least two states providing the antenna signal having the highest signal quality.

11. The method according to claim 10, wherein a data packet comprises a preamble part followed in time by a data part and the method determines the signal quality for each of the at least two antenna signals on the preamble part of a data packet and select for the data part of said data packet the state providing the antenna signal having the highest signal quality.

* * * * *